(12) United States Patent
Chu et al.

(10) Patent No.: US 11,855,109 B2
(45) Date of Patent: Dec. 26, 2023

(54) IMAGE SENSOR DEVICE AND METHOD

(71) Applicant: Taiwan Semiconductor Manufacturing Co., Ltd., Hsinchu (TW)

(72) Inventors: Yen-Chang Chu, Tainan (TW); Yeur-Luen Tu, Taichung (TW); Cheng-Yuan Tsai, Chu-Pei (TW)

(73) Assignee: TAIWAN SEMICONDUCTOR MANUFACTURING COMPANY, LTD, Hsin-Chu (TW)

(*) Notice: Subject to any disclaimer, the term of this patent is extended or adjusted under 35 U.S.C. 154(b) by 0 days.

(21) Appl. No.: 17/549,501

(22) Filed: Dec. 13, 2021

(65) Prior Publication Data
US 2022/0102396 A1 Mar. 31, 2022

Related U.S. Application Data

(62) Division of application No. 16/568,586, filed on Sep. 12, 2019, now Pat. No. 11,201,183, which is a division of application No. 15/610,034, filed on May 31, 2017, now Pat. No. 10,748,948, which is a division of application No. 14/996,462, filed on Jan. 15, 2016, now Pat. No. 9,673,239.

(51) Int. Cl.
*H01L 27/146* (2006.01)

(52) U.S. Cl.
CPC ...... *H01L 27/1462* (2013.01); *H01L 27/1464* (2013.01); *H01L 27/14607* (2013.01); *H01L 27/14645* (2013.01); *H01L 27/14685* (2013.01); *H01L 27/14609* (2013.01); *H01L 27/14621* (2013.01); *H01L 27/14627* (2013.01)

(58) Field of Classification Search
CPC .............. H01L 27/1462; H01L 27/146–14893
See application file for complete search history.

(56) References Cited

U.S. PATENT DOCUMENTS

| | | | | |
|---|---|---|---|---|
| 5,258,608 A | * | 11/1993 | Uchiya | H01L 27/14643 257/E31.121 |
| 2006/0163451 A1 | | 7/2006 | Park et al. | |
| 2006/0205107 A1 | * | 9/2006 | Inaba | G02B 5/201 438/57 |
| 2006/0208285 A1 | | 9/2006 | Inoue et al. | |

(Continued)

OTHER PUBLICATIONS

"Antireflection Coatings" available at URL: https://angstromengineering.com/applications/introduction-optical-coatings/antireflection-coatings/ (Year: 2023).*

(Continued)

*Primary Examiner* — Erik Kielin
(74) *Attorney, Agent, or Firm* — Slater Matsil, LLP

(57) ABSTRACT

A system and method for forming pixels in an image sensor is provided. In an embodiment, a semiconductor device includes an image sensor including a first pixel region and a second pixel region in a substrate, the first pixel region being adjacent to the second pixel region. A first anti-reflection coating is over the first pixel region, the first anti-reflection coating reducing reflection for a first wavelength range of incident light. A second anti-reflection coating is over the second pixel region, the second anti-reflection coating reducing reflection for a second wavelength range of incident light that is different from the first wavelength range.

20 Claims, 9 Drawing Sheets

(56) References Cited

U.S. PATENT DOCUMENTS

| | | |
|---|---|---|
| 2007/0131988 A1 | 6/2007 | Lin |
| 2008/0265349 A1 | 10/2008 | Kasano et al. |
| 2009/0045477 A1* | 2/2009 | Narui ............... G02B 1/11 |
| | | 257/E31.127 |
| 2009/0302409 A1 | 12/2009 | Qian et al. |
| 2010/0025790 A1 | 2/2010 | Jang |
| 2011/0057279 A1* | 3/2011 | Lee ............... H01L 27/14685 |
| | | 257/E31.127 |
| 2011/0057282 A1 | 3/2011 | Ellis-Monaghan et al. |
| 2011/0108705 A1 | 5/2011 | Izuha et al. |
| 2011/0159632 A1 | 6/2011 | Sueyoshi |
| 2011/0309462 A1 | 12/2011 | Sargent et al. |
| 2012/0033116 A1 | 2/2012 | Kato |
| 2012/0146117 A1 | 6/2012 | Kuwazawa |
| 2013/0154041 A1* | 6/2013 | Kokubun ............ H01L 27/146 |
| | | 257/E31.127 |
| 2014/0145282 A1 | 5/2014 | Shen et al. |
| 2014/0217486 A1 | 8/2014 | Akiyama |
| 2014/0263958 A1* | 9/2014 | Her ............... H01L 27/14636 |
| | | 250/208.1 |
| 2015/0008553 A1 | 1/2015 | Choi et al. |
| 2015/0084144 A1 | 3/2015 | Suzuki et al. |
| 2015/0171126 A1 | 6/2015 | Seki et al. |
| 2016/0065914 A1 | 3/2016 | Choi et al. |
| 2016/0343761 A1 | 11/2016 | Ishino et al. |
| 2017/0317131 A1 | 11/2017 | Shimada et al. |

OTHER PUBLICATIONS

Williams, Kirt, R. et al., "Etch Rates for Micromachining Processing—Part II," in Journal of Microelectromechanical Systems, vol. 12, No. 6, Dec. 2003, pp. 761-778 (2003).

\* cited by examiner

IMAGE SENSOR DEVICE AND METHOD

PRIORITY CLAIM AND CROSS-REFERENCE

This is a divisional application of U.S. patent application Ser. No. 16/568,586, entitled "Image Sensor Device and Method," filed on Sep. 12, 2019, which is a divisional application of U.S. patent application Ser. No. 15/610,034, entitled "Image Sensor Device and Method," filed on May 31, 2017, which is a divisional application of U.S. patent application Ser. No. 14/996,462, entitled "Image Sensor Device and Method," which was filed on Jan. 15, 2016 and issued as U.S. Pat. No. 9,673,239 on Jun. 6, 2017, which applications are incorporated herein by reference.

BACKGROUND

Complementary metal oxide semiconductor image sensors (CIS) generally utilize a series of photodiodes formed within an array of pixel regions of a semiconductor substrate in order to sense when light has impacted the photodiode. Adjacent to each of the photodiodes within each of the pixel regions a transfer transistor may be formed in order to transfer the signal generated by the sensed light within the photodiode at a desired time. Such photodiodes and transfer transistors allow for an image to be captured at a desired time by operating the transfer transistor at the desired time.

The complementary metal oxide semiconductor image sensors may generally be formed in either a front side illumination configuration or a back-side illumination configuration. In a front-side illumination configuration light passes to the photodiode from the "front" side of the image sensor where the transfer transistor has been formed. In a back-side illumination configuration, the transfer transistor, the metal layers, and the dielectric layers are formed on the front side of the substrate, and light is allowed to pass to the photodiode from the "back" side of the substrate such that the light hits the photodiode before it reaches the transfer transistor, the dielectric layers, or the metal layers. Some configurations of CIS include an anti-reflection coating (ARC) that allows more light to reach the photodiode by reducing the amount of light reflected from the substrate and away from the photodiode.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
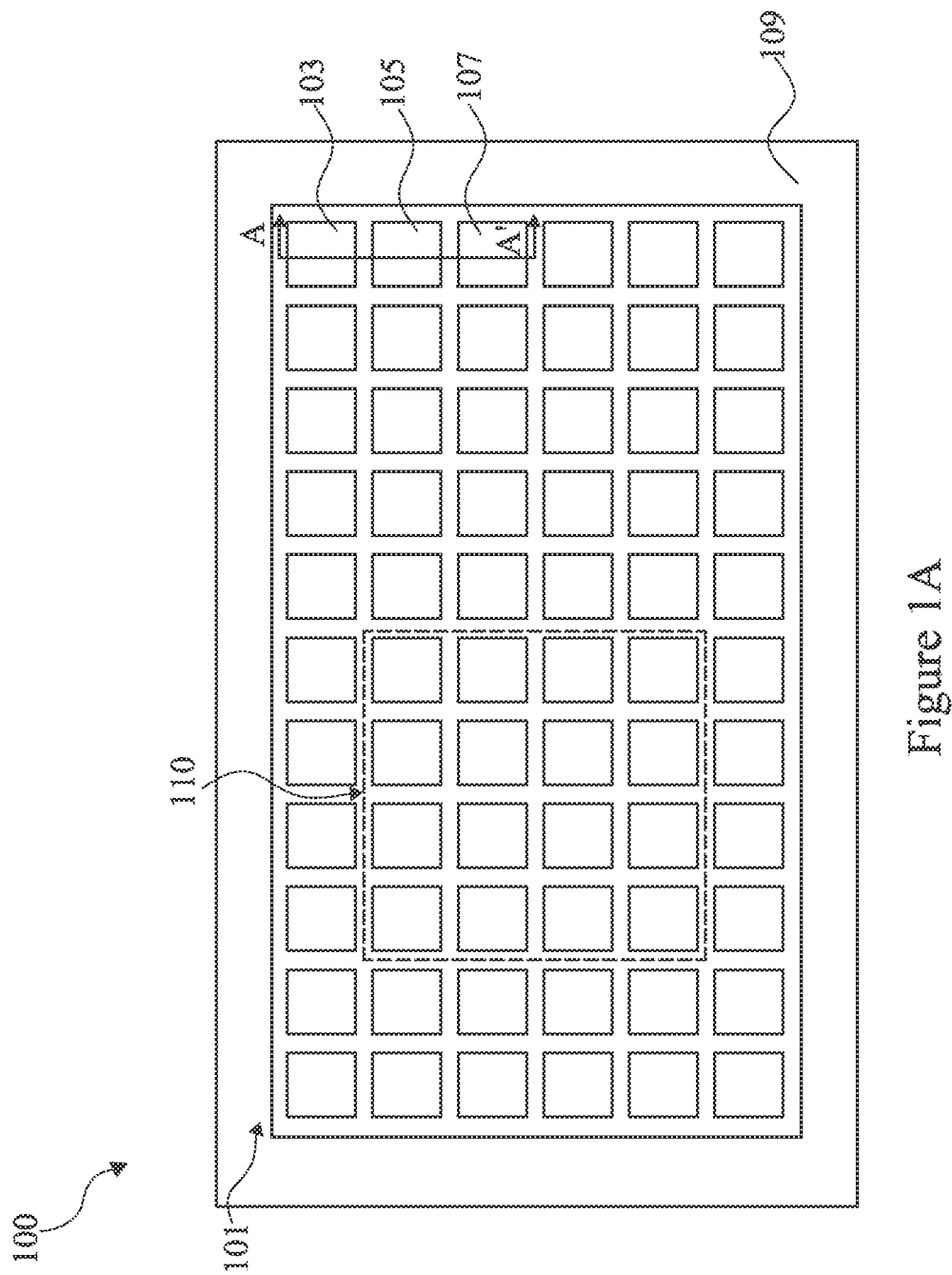
FIG. 1A illustrates an image sensor with an array of pixel regions in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1A, there is shown an image sensor 100 which comprises a grid or array of backside illuminated pixel regions 101. An example portion of the array of pixel regions 101 is shown as pixel array 110. Example pixel regions are shown as a first pixel region 103, a second pixel region 105, and a third pixel region 107. In other embodiments, the image sensor 100 may be a frontside illuminated type of image sensor. The image sensor 100 also may comprise a logic region 109 located adjacent to the array of pixel regions 101. The logic region 109 may have additional circuitry and contacts for input and output connections to and from the array of pixel regions 101. The logic region 109 is utilized to provide an operating environment for the pixel regions 101 and to moderate communications between the array of pixel regions 101 and other external devices (not shown).

Figure 1B:
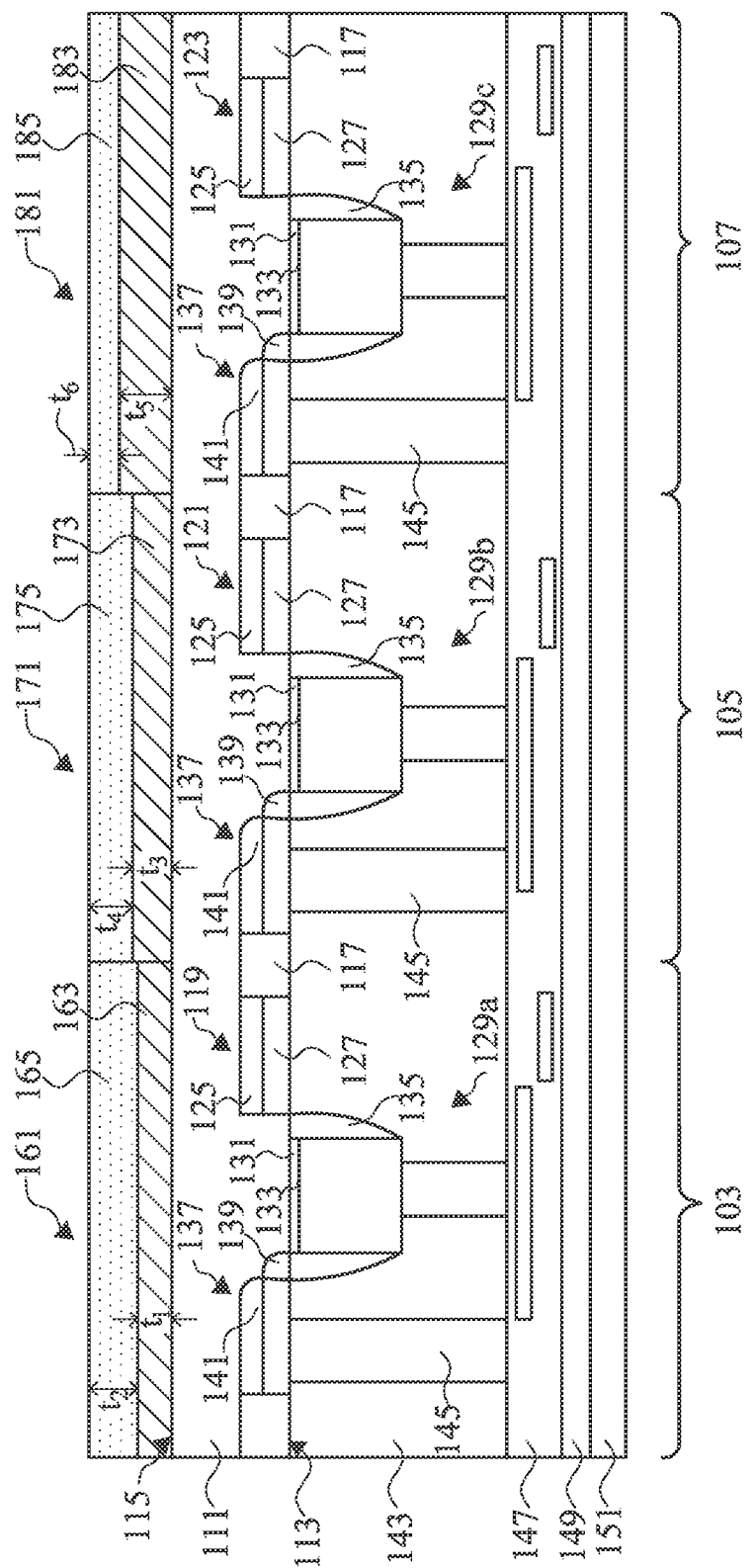
FIG. 1B illustrates anti-reflection coatings over a first photosensitive diode, a second photosensitive diode, and a third photosensitive diode in a substrate in accordance with some embodiments.

FIG. 1B illustrates a simplified cross sectional view of adjacent pixel regions including the first pixel region 103, the second pixel region 105, and the third pixel region 107 through line A-A' in FIG. 1A. FIG. 1B shows a substrate 111 with the first pixel region 103, the second pixel region 105, and the third pixel region 107 separated by isolation regions 117. The substrate 111 may comprise a front side 113 and a back side 115 and may be a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, with other crystal orientations, may also be used. Additionally, the substrate 111 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate 111 may be doped with a p-type dopant, such as boron, gallium, although the substrate may alternatively be doped with an n-type dopant, as is known in the art.

The isolation regions 117 may be located within the substrate 111 between the first pixel region 103, the second pixel region 105, and the third pixel region 107 in order to separate and isolate the first pixel region 103, the second pixel region 105, and the third pixel region 107. The isolation regions 117 may be shallow trench isolations generally formed by etching the substrate 111 to form a trench and filling the trench with dielectric material as is known in the art. The isolation regions 117 may be filled with a dielectric material such as an oxide material, a high-density plasma (HDP) oxide, or the like, formed by conventional methods known in the art. Optionally, an oxide liner may be formed along the sidewalls of the isolation regions 117.

A first photosensitive diode 119 may be formed in first pixel region 103, a second photosensitive diode 121 may be formed in second pixel region 105, and a third photosensitive diode 123 may be formed in third pixel region 107. The first photosensitive diode 119, the second photosensitive diode 121, and the third photosensitive diode 123 may be utilized to generate a signal related to the intensity or brightness of light that impinges on the respective photosensitive diode. In an embodiment, the first photosensitive diode 119, the second photosensitive diode 121, and the third photosensitive diode 123 may comprise n-type doped regions 125 formed in the substrate 111 (which in this embodiment may be a p-type substrate) and also may comprise heavily doped p-type doped regions 127 formed on the surface of the n-type doped regions 125 to form a p-n-p junction.

The n-type doped regions 125 may be formed, e.g., using a photolithographic masking and implantation process. For example, a first photoresist (not shown in FIG. 1B) may be placed on the substrate 111. The first photoresist, may comprise a conventional photoresist material, such as a deep ultra-violet (DUV) photoresist, and may be deposited on the surface of the substrate 111, for example, by using a spin-on process to place the first photoresist. However, any other suitable material or method of forming or placing the first photoresist may alternatively be utilized. Once the first photoresist has been placed on the substrate 111, the first photoresist may be exposed to energy, e.g. light, through a patterned reticle in order to induce a reaction in those portions of the first photoresist exposed to the energy. The first photoresist may then be developed, and portions of the first photoresist may be removed, exposing a portion of the substrate 111 where the first photosensitive diode 119, the second photosensitive diode 121, and the third photosensitive diode 123 are desired to be located.

Once the first photoresist has been placed and developed, the heavily doped n-type doped regions 125 may be formed by implanting n-type dopants (e.g., phosphorous, arsenic, antimony, or the like) through the first photoresist. In an embodiment the n-type doped regions 125 may be implanted such that their concentration of between about 1e15 atom/cm³ and about 1e20 atom/cm³, such as about 8e15 atom/cm³. However, any suitable alternative concentration for the heavily doped n-type doped regions 125 may alternatively be utilized.

After the n-type doped regions 125 have been formed (e.g., through the implantation process), the p-type doped regions 127 may be formed using, e.g., an ion implantation process using the first photoresist as a mask. The p-type doped regions 127 may be formed to extend into the substrate 111 between about 1 μm and about 4 μm. Additionally, the p-type doped regions 127 may be formed to have a concentration of between about 1e15 atom/cm³ and about 5e19 atom/cm³, such as about 1e16 atom/cm³. Once the first photosensitive diode 119, the second photosensitive diode 121, and the third photosensitive diode 123 have been formed, the first photoresist may be removed. In an embodiment, the first photoresist may be removed using a process such as ashing.

Further, as one of ordinary skill in the art will recognize the first photosensitive diode 119, the second photosensitive diode 121, and the third photosensitive diode 123 described above are merely one type of photosensitive diodes that may be used in the embodiments. Any suitable photodiode may be utilized with the embodiments, and all of these photodiodes are intended to be included within the scope of the embodiments. Additionally, the precise methods or order of steps described above may be modified, such as by forming the p-type doped regions 127 prior to the formation of the n-type doped regions 125, while still remaining within the scope of the embodiments.

A first transistor 129a, a second transistor 129b, and a third transistor 129c may be formed adjacent to the first photosensitive diode 119, the second photosensitive diode 121, and the third photosensitive diode 123, in the first pixel region 103, the second pixel region 105, and the third pixel region 107, respectively. The first transistor 129a, the second transistor 129b, and the third transistor 129c may be transfer transistors. However, the first transistor 129a, the second transistor 129b, and the third transistor 129c are also merely representative of the many types of functional transistors that may be utilized within the first pixel region 103, the second pixel region 105, and the third pixel region 107. For example, while the first transistor 129a, the second transistor 129b, and the third transistor 129c are illustrated in FIG. 1B as transfer transistors, embodiments may additionally include other transistors located within the first pixel region 103, the second pixel region 105, and the third pixel region 107, such as reset transistors, source follower transistors, or select transistors. These transistors may be arranged, for example, to form a four transistor CMOS image sensor (CIS). All suitable transistors and configurations that may be utilized in an image sensor are fully intended to be included within the scope of the embodiments.

The first transistor 129a, the second transistor 129b, and the third transistor 129c may comprise gate stacks that may be formed over the substrate 111. The gate stacks may each comprise a gate dielectric 131 and a gate electrode 133. The gate dielectrics 131 and gate electrodes 133 may be formed and patterned on the substrate 111 by any suitable process known in the art. The gate dielectrics 131 may be a high-k dielectric material, such as silicon oxide, silicon oxynitride, silicon nitride, an oxide, a nitrogen-containing oxide, aluminum oxide, lanthanum oxide, hafnium oxide, zirconium oxide, hafnium oxynitride, a combination thereof, or the like. The gate dielectrics 131 may have a relative permittivity value greater than about 4.

In an embodiment in which the gate dielectrics 131 comprise an oxide layer, the gate dielectrics 131 may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. In one embodiment, the gate dielectrics 131 may be between about 10 Å to about 150 Å in thickness, such as 100 Å in thickness.

The gate electrodes 133 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In one example, amorphous silicon is deposited and recrystallized to create poly-crystalline silicon (poly-silicon). In an embodiment in which the gate electrodes 133 is poly-silicon, the gate electrodes 133 may be formed by depositing doped or undoped poly-silicon by low-pressure chemical vapor deposition (LPCVD) to a thickness in the range of about 100 Å to about 2,500 Å, such as 1,200 Å.

Spacers 135 may be formed on the sidewalls of the gate dielectrics 131 and the gate electrodes 133. The spacers 135 may be formed by blanket depositing a spacer layer (not shown) on the previously formed structure. The spacer layer may comprise SiN, oxynitride, SiC, SiON, oxide, and the like, and may be formed by commonly used methods such as chemical vapor deposition (CVD), plasma enhanced CVD, sputter, and other methods known in the art. The spacer layer is then patterned to form the spacers 135, such as by anisotropically etching to remove the spacer layer from the horizontal surfaces of the structure.

Source/drain regions 137 may be formed in the substrate 111 on an opposing side of the gate dielectrics 131 from the first photosensitive diode 119, the second photosensitive diode 121, and the third photosensitive diode 123. In an embodiment in which the substrate 111 is a p-type substrate, the source/drain regions 137 may be formed by implanting appropriate n-type dopants such as phosphorous, arsenic or antimony. The source/drain regions 137 may be implanted using the gate electrodes 133 and the spacers 135 as masks to form lightly doped source/drain (LDD) regions 139 and heavily doped source/drain regions 141.

It should be noted that one of ordinary skill in the art will realize that many other processes, steps, or the like may be used to form the source/drain regions 137 and the first photosensitive diode 119, the second photosensitive diode 121, and the third photosensitive diode 123. For example, one of ordinary skill in the art will realize that a plurality of implants may be performed using various combinations of spacers and liners to form the source/drain regions 137 and the first photosensitive diode 119, the second photosensitive diode 121, and the third photosensitive diode 123 having a specific shape or characteristic suitable for a particular purpose. Any of these processes may be used to form the source/drain regions 137 and the first photosensitive diode 119, the second photosensitive diode 121, and the third photosensitive diode 123, and the above description is not meant to limit the embodiments to the steps presented above.

Once the first transistor 129a, the second transistor 129b, and the third transistor 129c have been formed, a first inter-layer dielectric (ILD) layer 143 may be formed over the first pixel region 103, the second pixel region 105, and the third pixel region 107 and contacts 145 may be formed through the first ILD layer 143. The first ILD layer 143 may comprise a material such as boron phosphorous silicate glass (BPSG), although any suitable dielectrics may be used for either layer. The first ILD layer 143 may be formed using a process such as PECVD, although other processes, such as LPCVD, may alternatively be used. The first ILD layer 143 may be formed to a thickness of between about 100 Å and about 3,000 Å.

The contacts 145 may be formed through the first ILD layer 143 with suitable photolithography and etching techniques. In an embodiment a first photoresist material is utilized to create a patterned mask to define contacts 145. Additional masks, such as a hardmask, may also be used. An etching process, such as an anisotropic or isotropic etch process, is performed to etch the first ILD layer 143.

Contacts 145 may then be formed so as to contact the substrate 111 and the gate electrodes 133. The contacts 145 may comprise a barrier/adhesion layer (not individually shown in FIG. 1B) to prevent diffusion and provide better adhesion for the contacts 145. In an embodiment, the barrier layer is formed of one or more layers of titanium, titanium nitride, tantalum, tantalum nitride, or the like. The barrier layer may be formed through chemical vapor deposition, although other techniques could alternatively be used. The barrier layer may be formed to a combined thickness of about 50 Å to about 500 Å.

The contacts 145 may be formed of any suitable conductive material, such as a highly-conductive, low-resistive metal, elemental metal, transition metal, or the like. In an exemplary embodiment the contacts 145 are formed of tungsten, although other materials, such as copper, could alternatively be utilized. In an embodiment in which the contacts 145 are formed of tungsten, the contacts 145 may be deposited by CVD techniques known in the art, although any method of formation could alternatively be used.

After the contacts 145 are formed, further processing of the front side 113 of the substrate 111 may be performed. This processing may comprise forming various conductive and dielectric layers (collectively referred to in FIG. 1B by the reference number 147) in order to form interconnections between the individually formed devices to each other. These interconnections may be made through any suitable formation process (e.g., lithography with etching, damascene, dual damascene, or the like) and may be formed using suitable conductive materials such as aluminum alloys, copper alloys, or the like.

Additionally, once the interconnections have been formed over the first ILD layer 143, a passivation layer 149 may be formed in order to protect the underlying layers from physical and chemical damage. The passivation layer 149 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The passivation layer 149 may be formed through a process such as chemical vapor deposition (CVD), although any suitable process may be utilized.

FIG. 1B also illustrates a placement of the substrate 111 on a carrier wafer 151 and further processing on the back side 115 of the substrate 111 that may be performed after the processing on the front side 113 of the substrate 111. The carrier wafer 151 may be utilized to provide support and protection to the structures on the front side 113 of the substrate 111 while the back side 115 is further processed, and the carrier wafer 151 may comprise a material such as glass, silicon, glass ceramics, combinations of these, or the like. The substrate 111 may be attached to the carrier wafer 151 using, e.g., an adhesive (not individually illustrated in FIG. 1B), although any suitable method of attaching the substrate 111 to the carrier wafer 151 may alternatively be utilized.

Alternatively, the substrate 111 may be wafer bonded to another wafer (not illustrated) instead of the carrier wafer 151. In this embodiment the substrate 111 may be physically and electrically connected through the conductive and dielectric layers 147 and the passivation layer 149 to another wafer in order to provide signals and/or power between the substrate 111 and the other wafer. This and any other method of protecting the front side 113 of the substrate 111 may alternatively be utilized, and all such methods are fully intended to be included within the scope of the embodiment.

Once the substrate 111 has been placed on the carrier wafer 151, the back side 115 of the substrate 111 may be processed further. In an embodiment, the thickness of the back side 115 of the substrate 111 may be reduced or thinned. Thinning reduces the distance that light travels through the back side 115 of the substrate 111 before it reaches the first photosensitive diode 119, the second photosensitive diode 121, or the third photosensitive diode 123. The thinning of the back side 115 of the substrate 111 may be performed using a removal process such as chemical mechanical polishing (CMP). In a CMP process, a combination of etching materials and abrading materials are put into contact with the back side 115 of the substrate 111 and a grinding pad (not shown) is used to grind away the back side 115 of the substrate 111 until a desired thickness is achieved. However, any suitable process for thinning the back side 115 of the substrate 111, such as etching or a combination of CMP and etching, may alternatively be used. The back side 115 of the substrate 111 may be thinned so that the substrate 111 has a thickness of between about 2 µm and about 2.3 µm.

FIG. 1B illustrates the formation of a first ARC 161, a second ARC 171, and a third ARC 181 over the back side 115 of the substrate 111. In an embodiment, the first ARC 161, the second ARC 171, and the third ARC 181 may be used to reduce the amount of incident light reflected away from the first photosensitive diode 119, the second photosensitive diode 121, and the third photosensitive diode 123, and thus allow more light to impinge on the first photosensitive diode 119, the second photosensitive diode 121, and the third photosensitive diode 123. In this manner, the efficiency of the image sensor 100 may be increased, and the signal-to-noise ratio of the image sensor 100 may also be increased.

In an embodiment, the first ARC 161, the second ARC 171, and the third ARC 181 may be configured to reduce reflection for specific colors (i.e., specific wavelengths or wavelength ranges) of incident light. For example, the first ARC 161, the second ARC 171, and the third ARC 181 may be configured to reduce reflection for wavelengths of light corresponding to one of the primary colors (blue, green, red). Each of the first ARC 161, the second ARC 171, and the third ARC 181 may comprise one or more layers of different thicknesses and/or one or more layers of different materials, as discussed below.

In an embodiment, the first ARC 161 may be formed over the back side 115 of the substrate 111 in the first pixel region 103. The first ARC 161 may be formed by forming a first sublayer 163 and a second sublayer 165. The first sublayer 163 and the second sublayer 165 may be formed through a process such as CVD, PECVD, or combinations of these. The first sublayer 163 and the second sublayer 165 may be made of one or more suitable dielectric materials such as silicon oxide, silicon nitride, high-k dielectrics, combinations of these, or the like. For example, the first sublayer 163 may be a material such as silicon oxide, although any other suitable material may alternatively be utilized. The first sublayer 163 may be formed to a first thickness $t_1$ of between about 20 Å and about 5000 Å, such as about 500 Å. In some embodiments, the first sublayer 163 may be patterned over the first pixel region 103 using a suitable photolithographic masking and etching process.

Once the first sublayer 163 has been formed over the first pixel region 103, the second sublayer 165 may be formed over the first sublayer 163. The second sublayer 165 may be a different material than the first sublayer 163. For example, in some embodiments the first sublayer 163 is silicon oxide and the second sublayer 165 is silicon nitride. The second sublayer 165 may be formed to a second thickness $t_2$ that is different from the first thickness $t_1$ of the first sublayer 163. The second sublayer 165 may be formed to a thickness $t_2$ of between about 20 Å and about 5000 Å, such as about 500 Å.

In some embodiments, after the second sublayer 165 is formed over the first sublayer 163, over the third sublayer 173 (after the third sublayer 173 has been formed as further described below), and over the fifth sublayer 183 (after the fifth sublayer 183 has been formed as further described below), the second sublayer 165 may be planarized or thinned to a desired thickness (e.g., second thickness $t_2$). For example, the second sublayer 165 may be deposited to a thickness greater than the second thickness $t_2$ and then thinned to the second thickness $t_2$. The thinning of the second sublayer 165 may be performed using a procedure such as CMP, etching, or another procedure or combination of procedures.

In other embodiments, the second sublayer 165 may be patterned over the first sublayer 163 in first pixel region 103 using a suitable photolithographic masking and etching process. The photolithographic process for forming the second sublayer 165 may use the same photolithographic mask as used for forming the first sublayer 163 or a different photolithographic mask.

In other embodiments, the first ARC 161 may comprise fewer layers (e.g., one of the first sublayer 163 or the second sublayer 165) or more layers (e.g., three or more sublayers). To reduce reflection, other combinations of layer thicknesses, numbers of layers, and layer materials are possible. The anti-reflection properties of the first ARC 161 (e.g., wavelength range, amount of reflection reduction, or other properties) may be determined by the material and the first thickness $t_1$ of the first sublayer 163 and the material and the second thickness $t_2$ of the second sublayer 165. For example, in one embodiment the first sublayer 163 of the first ARC 161 may comprise silicon oxide and the second sublayer 165 may comprise a nitride such as SiN. Other pairs of different materials for the first sublayer 163 and the second sublayer 165 may also be used such as combinations of oxide and SiC, oxide and SiN, $Al_2O_3$ and SiN, $HfO_2$ and SiN, respectively, or other pairs of these or other materials.

In some embodiments, the first sublayer 163 and the second sublayer 165 may be the same material. In some embodiments, the first ARC 161 comprises three sublayers having a combination of materials such as a layer of oxide, a layer of SiN, and another layer of oxide, a combination such as a layer of oxide, a layer of SiC, and a layer of SiN, a combination such as a layer of $Al_2O_3$, a layer of $HfO_2$, and a layer of plasma-enhanced silicon nitride (PESN), or other combinations of these or other materials. The oxide may be a silicon oxide (e.g., a silicon oxide formed from remote plasma oxidation (RPO), a silicon oxide layer formed from TEOS, a silicon-rich oxide (SRO), or another type) or another type of oxide. The examples provided herein are not intended to limit the scope of this disclosure.

As shown in FIG. 1B, the example image sensor 100 may also include a second ARC 171 over the second pixel region 105. The second ARC 171 may be formed in a similar manner to the first ARC 161. As such, the second ARC 171 may comprise a third sublayer 173 with a third thickness $t_3$ and a fourth sublayer 175 with a fourth thickness $t_4$. The third thickness $t_3$ and the fourth thickness $t_4$ may have thicknesses of between about 20 Å and about 5000 Å, such as about 500 Å. The composition and/or third thickness $t_3$ of the third sublayer 173 and the composition and/or fourth thickness $t_4$ of the fourth sublayer 175 in the second ARC 171 may be specified to reduce reflection for a specific color of light. The second ARC 171 may be formed to reduce reflection for colors of incident light different than the first ARC 161. For example, the first ARC 161 may be formed to reduce reflection for blue light incident on first pixel region 103, and the second ARC 171 may be formed to reduce reflection for green light incident on second pixel region 105.

In some embodiments, the third thickness $t_3$ of the third sublayer 173 in the second ARC 171 may be greater than the first thickness $t_1$ of the first sublayer 163 in the first ARC 161. For example, the third thickness $t_3$ may be between about 20 nm and about 300 nm, such as about 80 nm and the first thickness $t_1$ may be between about 15 nm and about 295 nm, such as about 50 nm. In some embodiments, the fourth thickness $t_4$ of the fourth sublayer 175 in the second ARC 171 is less than the second thickness $t_2$ of the second sublayer 165 in the first ARC 161. For example, the fourth thickness $t_4$ may be between about 20 nm and about 300 nm, such as about 50 nm and the second thickness $t_2$ may be between about 25 nm and about 305 nm, such as about 80 nm. In some embodiments, the second ARC 171 may comprise one layer or three or more sublayers.

As shown in FIG. 1B, the example image sensor 100 may also include a third ARC 181 over the third pixel region 107. The third ARC 181 may be formed in a similar manner to the first ARC 161 and/or the second ARC 171. As such, the third ARC 181 may comprise a fifth sublayer 183 with a fifth thickness $t_5$ and a sixth sublayer 185 with a sixth thickness $t_6$. The composition and/or fifth thickness $t_5$ of the fifth sublayer 183 and the composition and/or sixth thickness $t_6$ of the sixth sublayer 185 in the third ARC 181 may be specified to reduce reflection for a specific color of light. The third ARC 181 may be formed to reduce reflection for colors of incident light different than the first ARC 161 or the second ARC 171. For example, the first ARC 161 may be formed to reduce reflection for blue light incident on first pixel region 103, the second ARC 171 may be formed to reduce reflection for green light incident on second pixel region 105, and the third ARC 181 may be formed to reduce reflection for red light incident on the third pixel region 107.

In some embodiments, the fifth thickness $t_5$ of the fifth sublayer 183 in the third ARC 181 may be greater than the first thickness $t_1$ of the first sublayer 163 in the first ARC 161 and/or greater than the third thickness $t_3$ of the third sublayer 173 in the second ARC 171. For example, the fifth thickness $t_5$ may be about 80 nm, the third thickness $t_3$ may be about 60 nm, and the first thickness $t_1$ may be about 50 nm. In some embodiments, the sixth thickness $t_6$ of the sixth sublayer 185 in the third ARC 181 is less than the second thickness $t_2$ of the second sublayer 165 in the first ARC 161 and/or the fourth thickness $t_4$ of the fourth sublayer 175 in the second ARC 171. For example, the second thickness $t_2$ may be about 80 nm, the fourth thickness $t_4$ may be about 60 nm, and the sixth thickness $t_6$ may be about 50 nm. In some embodiments, the third ARC 181 may comprise one layer or three or more sublayers.

In some embodiments, the second sublayer 165, the fourth sublayer 175, and the sixth sublayer 185 are formed separately, for example using three separate photolithographic masking and etching processes. In some embodiments, the second sublayer 165, the fourth sublayer 175, and the sixth sublayer 185 are formed together, for example with a single deposition. In some cases, the second sublayer 165, the fourth sublayer 175, and the sixth sublayer 185 are planarized or thinned to the same height above the substrate 111. The thinning may be performed using a procedure such as CMP, etching, or another procedure or combination of procedures. For example, the second sublayer 165, the fourth sublayer 175, and the sixth sublayer 185 may be thinned such that the total thickness of the first ARC 161, the second ARC 171, and the third ARC 181 is the same. In some embodiments, one or more of the first ARC 161, the second ARC 171, and the third ARC 181 may comprise a different number of sublayers. For example, the first ARC 161 may comprise one layer and second ARC 171 may comprise two layers.

Figure 1C:
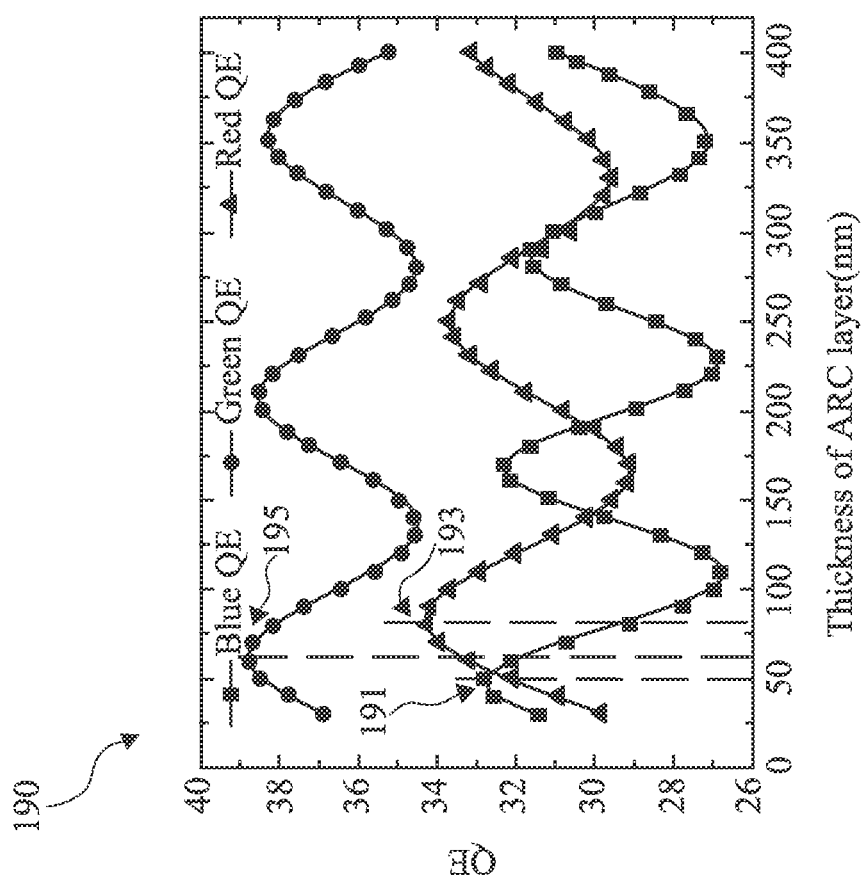
FIG. 1C illustrates a graph of quantum efficiency versus anti-reflection coating thickness in accordance with some embodiments.

FIG. 1C illustrates a graph 190 showing an example simulation of the quantum efficiency (QE) of a photosensitive diode for different colors of light (blue, green, red) and for different thicknesses of anti-reflection coatings (ARCs). For the simulation of graph 190, the ARC comprises a sublayer of silicon nitride over silicon oxide, with x-axis indicating the thickness of the silicon nitride layer. As graph 190 shows, the QE of the photodiode for each color varies with the thickness of the silicon nitride sublayer, and a single sublayer thickness does not correspond to an optimal QE for all colors. As shown in FIG. 1C, blue light QE has a maximum at a sublayer thickness of about 50 nm (near the first point 191), green light QE has a maximum at a sublayer thickness of about 60 nm (near the second point 193), and red light QE has a maximum at a sublayer thickness of about 80 nm (near the third point 195). Thus, an ARC comprising a single sublayer thickness of a single material will not necessarily correspond to a QE maximum for multiple colors of light, and pixel regions with different ARC properties for different pixel regions may improve QE for an image sensor.

Figure 2:
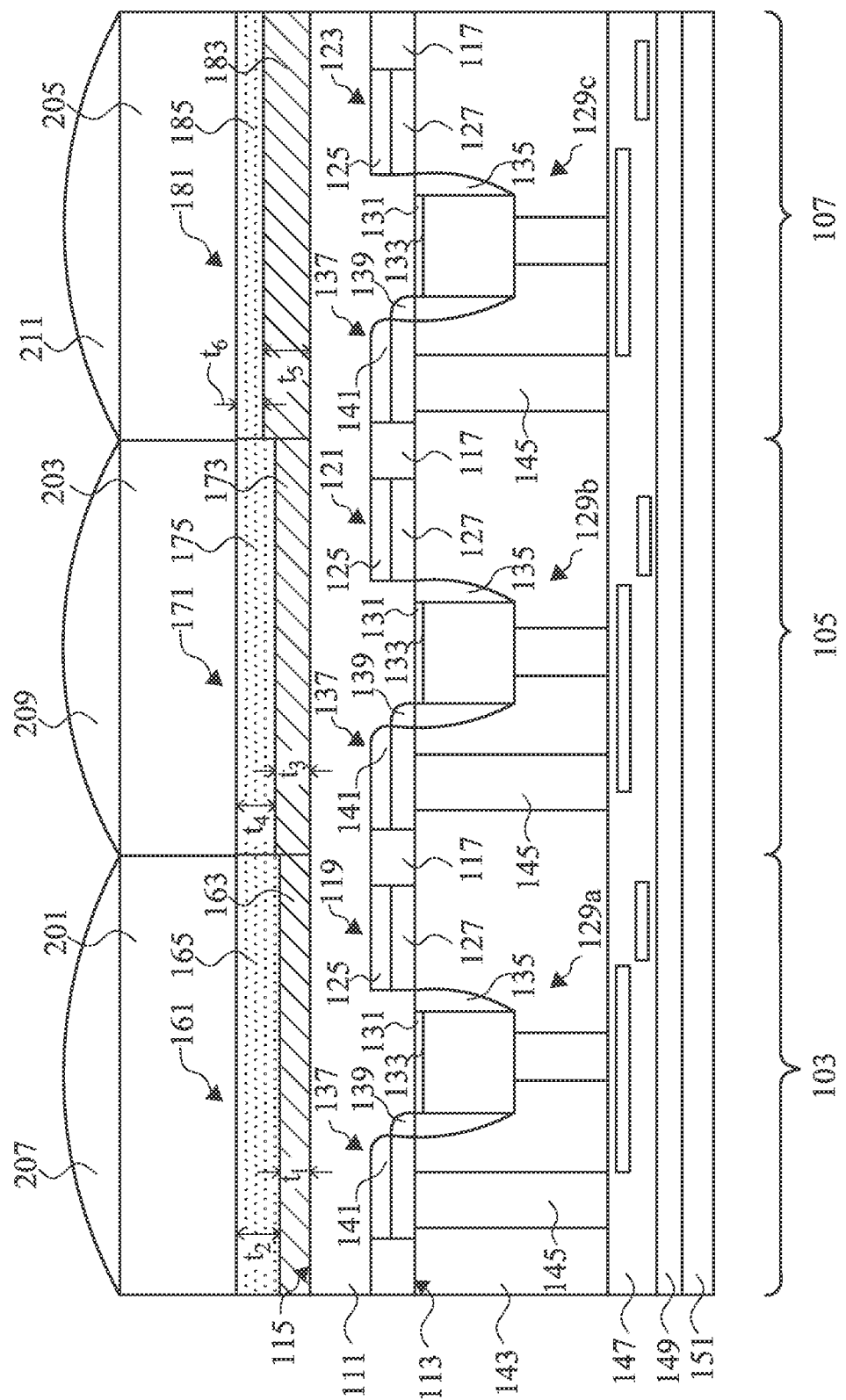
FIG. 2 illustrates a formation of color filters and microlenses over the substrate in accordance with some embodiments.

FIG. 2 illustrates the formation of a first color filter 201, a second color filter 203, and a third color filter 205 on the back side 115 of the substrate 111 over the first ARC 161, the second ARC 171, and the third ARC 181, respectively. FIG. 2 also illustrates the formation of a first microlens 207, a second microlens 209, and a third microlens 211 over the first color filter 201, the second color filter 203, and the third color filter 205, respectively. The first color filter 201, the second color filter 203, and the third color filter 205 may each comprise individual filters for one of the primary colors (e.g., blue, green, red) and may be positioned to filter the light that will impinge upon the first photosensitive diode 119, the second photosensitive diode 121, and the third photosensitive diode 123. The first color filter 201, the second color filter 203, and the third color filter 205 may each correspond to the properties of the first ARC 161, the second ARC 171, and the third ARC 181. For example, in the first pixel region 103, the first color filter 201 may permit blue light and the first ARC 161 may reduce reflections for blue light. Similarly, in the second pixel region 105, the second color filter 203 may permit green light and the second ARC 171 may reduce reflections for green light, and in the third pixel region 107, the third color filter 205 may permit red light and the third ARC 181 may reduce reflections for red light. The first color filter 201, the second color filter 203, and the third color filter 205 may be part of an array pattern of color filters. For example, the first color filter 201, the second color filter 203, and the third color filter 205 may be part of a Bayer RGB pattern, a Yotsuba CRGB pattern, or any other suitable pattern for the location of color filters over an image sensor 100. In some embodiments, the first color filter 201, the second color filter 203, and the third color filter 205 may be part of the pixel array 110, shown in FIG. 1A.

One or more of the first color filter 201, the second color filter 203, and the third color filter 205 may comprise a polymeric material or resin, such as a polymeric polymer, which includes colored pigments. In an embodiment in which polymeric polymers are utilized to form the first color filter 201, the second color filter 203, and the third color filter 205, each of the first color filter 201, the second color filter 203, and the third color filter 205 may be formed over the substrate 111 using a process such as spin coating. After spin coating a polymeric material over the substrate 111, the material may be patterned to form the first color filter 201, the second color filter 203, and/or the third color filter 205 using a suitable photolithographic masking and etching process. Any other suitable method for forming the first color filter 201, the second color filter 203, and/or the third color filter 205 may alternatively be utilized.

The first microlens 207, the second microlens 209, and the third microlens 211 may be formed over the first color filter 201, the second color filter 203, and the third color filter 205 by first applying and patterning a positive type photoresist (not shown). Once formed, the patterned photoresist may then be baked to round the photoresist into the first microlens 207, the second microlens 209, and the third microlens 211. The first microlens 207, the second microlens 209, and the third microlens 211 may be used to focus impinging light more directly onto the first photosensitive diode 119, the second photosensitive diode 121, and the third photosensitive diode 123, respectively.

Figure 3:
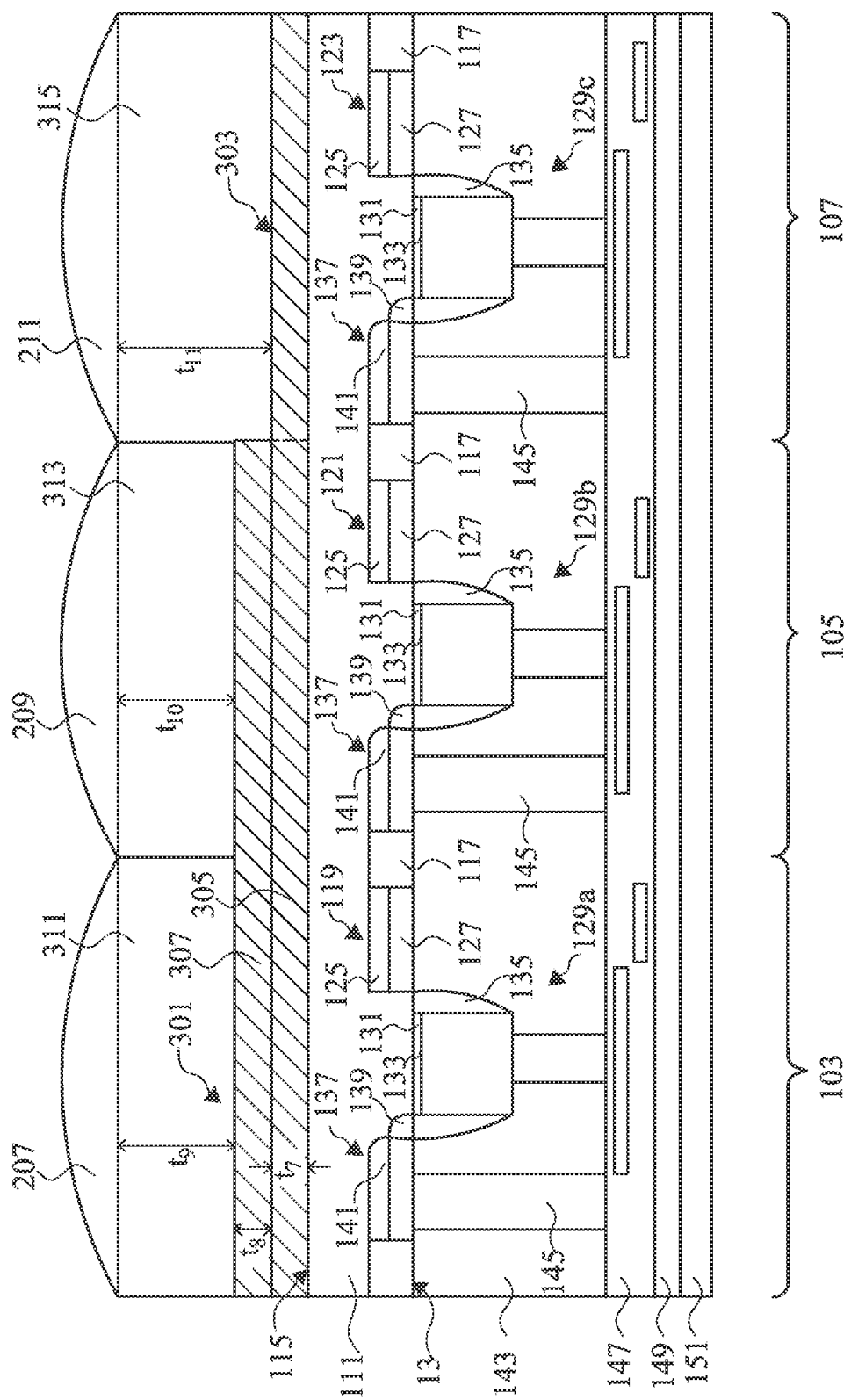
FIG. 3 illustrates a formation of anti-reflection coatings in accordance with some embodiments.

FIG. 3 illustrates an embodiment of an example image sensor comprising a fourth ARC 301 and a fifth ARC 303. The fourth ARC 301 is over both the first pixel region 103 and the second pixel region 105 and comprises a seventh sublayer 305 over an eighth sublayer 307. The fifth ARC 303 is over the third pixel region 107 and comprises the seventh sublayer 305.

The fourth ARC 301 and the fifth ARC 303 are formed by forming the seventh sublayer 305 over the back side 115 of the substrate 111. The seventh sublayer 305 may be formed over the first pixel region 103, the second pixel region, 105, and the third pixel region 107, as shown in FIG. 3. The seventh sublayer 305 has a seventh thickness of $t_7$ of between about 20 Å and about 5000 Å, such as about 300 Å. The seventh sublayer 305 may be formed through a process such as CVD, PECVD, thermal oxidation or combinations of these and made of one or more suitable dielectric materials such as silicon oxide, silicon nitride, high-k dielectric, combinations of these, or the like. In an embodiment, the seventh sublayer 305 may be patterned over the first pixel region 103 and the second pixel region 105 using a suitable photolithographic masking and etching process. In an embodiment, the seventh sublayer 305 may be formed over one pixel region (e.g., over the first pixel region 103), over two pixel regions (e.g., over both the first pixel region 103 and the second pixel region 105), or over another number of pixel regions.

The eighth sublayer 307 may be formed over the seventh sublayer 305. The eighth sublayer 307 may be formed having an eighth thickness of $t_8$ of between about 20 Å and about 5000 Å, such as about 300 Å. In the embodiment shown in FIG. 3, the eighth sublayer 307 is formed over both the first pixel region 103 and the second pixel region 105, and not over the third pixel region 107. The eighth sublayer 307 may be formed in a process similar to that of the seventh sublayer 305, and may be the same material as the seventh sublayer 305 or a different material.

As shown in the embodiment of FIG. 3, the first pixel region 103 and the second pixel region 105 both are covered by the fourth ARC 301, which comprises both the seventh sublayer 305 with a seventh thickness $t_7$ and the eighth sublayer 307 with an eighth thickness $t_8$. Thus, the total thickness of the fourth ARC 301 is the sum of the seventh thickness $t_7$ and the eighth thickness $t_8$. The third pixel region 107 is covered by the fifth ARC 303, which comprises the seventh sublayer 305, and thus the total thickness of the fifth ARC 303 is the seventh thickness $t_7$. The first pixel region 103 and the second pixel region 105 thus both comprise the fourth ARC 301 that reduces reflection over a first range of incident light wavelengths. The third pixel region 107 comprises the fifth ARC 303 that, having a different thickness, reduces reflection over a different range of incident light wavelengths than the fourth ARC 301. For example, the fourth ARC 301 may reduce reflection for two colors of light (e.g., blue and green, blue and red, or green and red) and the fifth ARC 303 may reduce reflection for another color of light (e.g., red, green, or blue).

In an embodiment, an additional third sublayer (not shown) may be formed. The additional third sublayer may be formed over a single pixel region (e.g., over the first pixel region 103, the second pixel region 105, or the third pixel region 107), or over multiple pixel regions (e.g., over both the first pixel region 103 and the second pixel region 105, over other combinations of pixel regions, or over all pixel regions). The additional third sublayer may be the same material as the seventh sublayer 305 and/or the eighth sublayer 307 or be a different material. In other embodiments, the seventh sublayer 305 and/or the eighth sublayer 307 may be silicon oxide, and the additional third layer may be a material such as silicon oxide, SiN, SiC, $Al_2O_3$, a layer of $HfO_2$, a high-k dielectric, combinations of these, or the like. The additional third sublayer may have a thickness of between about 20 Å and about 5000 Å, such as about 300 Å.

In other embodiments, more than three sublayers may be formed, and the ARC over a pixel region may comprise more than three sublayers. In this manner, different ARCs may be optimized for different colors of light for different pixel regions. A single ARC may be optimized for more than one color of light and formed over more than one pixel region.

A fourth color filter 311, a fifth color filter 313, and a sixth color filter 315 and the first microlens 207, the second microlens 209, and the third microlens 211 may be formed in the manner described previously with regard to FIG. 2. The ninth thickness $t_9$ of the fourth color filter 311, the tenth thickness $t_{10}$ of the fifth color filter 313, and the eleventh thickness $t_{11}$ of the sixth color filter 315 may both be the same or may each have a thickness of between about 300 nm and about 1000 nm. In another embodiment and as shown in FIG. 3, the ninth thickness $t_9$ and the tenth thickness $t_{10}$ may be about 600 nm, but the eleventh thickness $t_{11}$ may have a greater thickness of about 700 nm. In other embodiments, the ninth thickness $t_9$, the tenth thickness, and the eleventh thickness $t_{11}$ may have the same thickness or have different thicknesses in any suitable combination.

Figure 4:
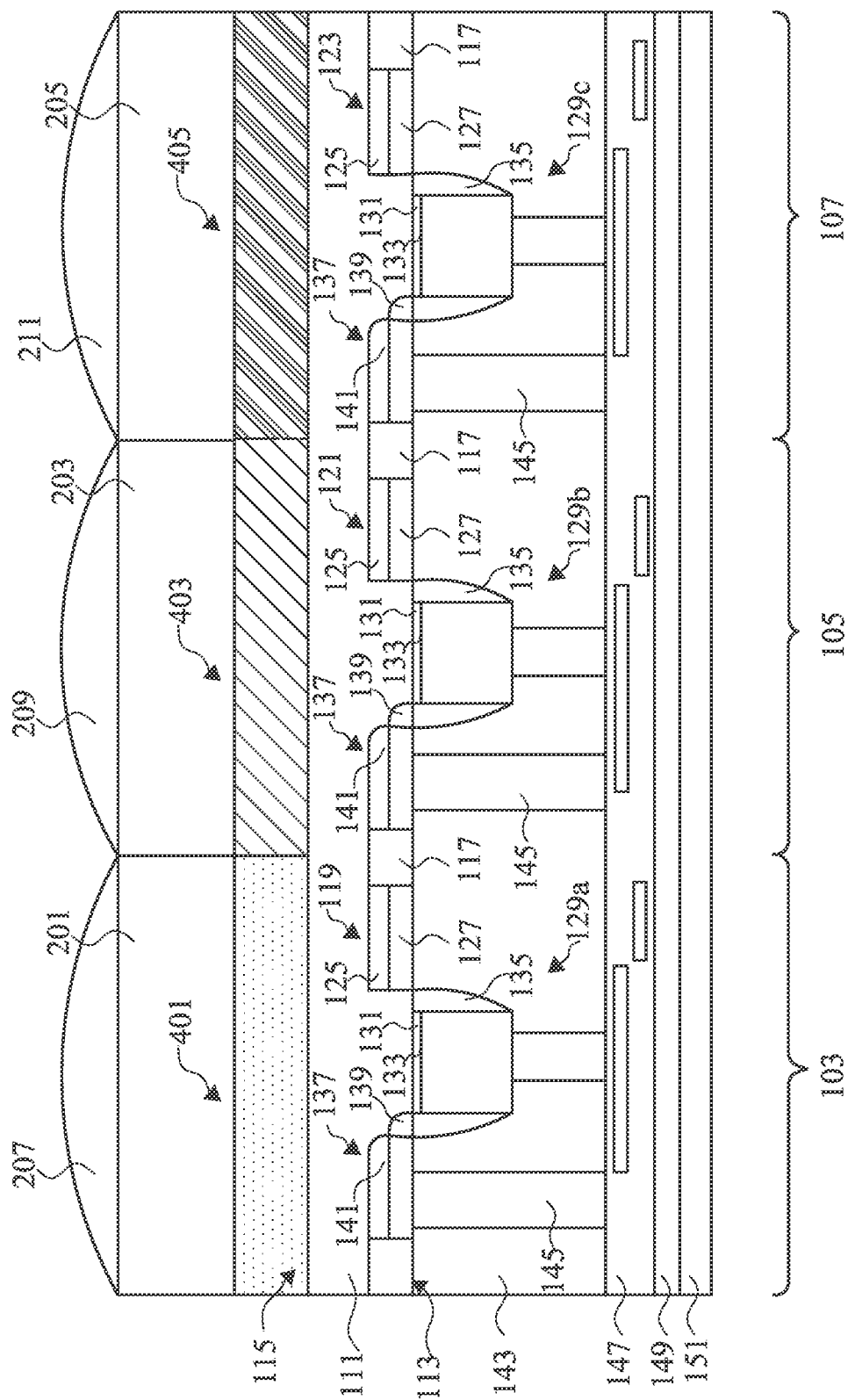
FIG. 4 illustrates a formation of anti-reflection coatings comprising different materials in accordance with some embodiments.

FIG. 4 illustrates an embodiment of a sixth ARC 401, a seventh ARC 403, and an eighth ARC 405. In this embodiment, each of the sixth ARC 401, the seventh ARC 403, and the eighth ARC 405 comprise different materials with different optical properties. For example, the sixth ARC 401, the seventh ARC 403, and the eighth ARC 405 may be formed through a process such as CVD, PECVD, thermal oxidation or combinations of these and made of one or more suitable dielectric materials such as silicon oxide, silicon nitride, high-k dielectrics, combinations of these, or the like. For example, the sixth ARC 401 may be silicon nitride, the seventh ARC 403 may be silicon oxide, and the eighth ARC 405 may be a high-k dielectric. Other materials and combinations of materials are possible.

As shown in FIG. 4, the sixth ARC 401, the seventh ARC 403, and the eighth ARC 405 may have the same thickness, though in other embodiments one or more of the sixth ARC 401, the seventh ARC 403, and the eighth ARC 405 may have different thicknesses. For example, the sixth ARC 401, the seventh ARC 403, and the eighth ARC 405 may have a thickness between about 20 Å and about 5000 Å, such as about 500 Å.

The sixth ARC 401, the seventh ARC 403, and the eighth ARC 405 may be formed over the first pixel region 103, the second pixel region 105, and the third pixel region 107, respectively, using a suitable deposition and photolithographic masking and etching process. For example, the sixth ARC 401 may be formed by depositing material over the substrate 111 and then patterning the material to form the sixth ARC 401 over the first pixel region 103 using photolithographic and etching techniques. Subsequently, a second material may be deposited and patterned to form the seventh ARC 403 over the second pixel region 105, and then a third material may be deposited and patterned to form the eighth ARC 405 over the third pixel region 107.

In some embodiments, a layer of a particular material may be formed over more than one pixel region. For example, a first material may be formed and patterned to form a single ARC over both the first pixel region 103 and the second pixel region 105. Then, a second material may be formed and patterned to form an ARC over the third pixel region 107. In some embodiments, one or more of the sixth ARC 401, the seventh ARC 403, and the eighth ARC 405 may comprise multiple sublayers of similar or different materials. These are examples; other configurations of ARCs with different materials formed over different pixel regions are possible.

By having different optical properties, each of the sixth ARC 401, the seventh ARC 403, and the eighth ARC 405 may reduce reflection for a different color of incident light. For example, three different materials may be selected for the sixth ARC 401, the seventh ARC 403, and the eighth ARC 405 to reduce reflection for blue, green, and red light, respectively. Each of the sixth ARC 401, the seventh ARC 403, and the eighth ARC 405 may have a different index of refraction between about 1.4 to 5. For example, the sixth ARC 401, the seventh ARC 403, and the eighth ARC 405 may each have a thickness of 500 Å, but the sixth ARC 401 may have a first refractive index of 1.5 to reduce reflection of blue light, the seventh ARC 403 may have a second refractive index of 1.9 to reduce reflection of green light, and the eighth ARC 405 may have a third refractive index of 2.2 to reduce reflection of red light.

In some embodiments, the sixth ARC 401, the seventh ARC 403, and the eighth ARC 405 may comprise the same material with different compositions that provide different optical properties. In this embodiment, the different optical properties may be achieved by using different formation conditions such as flow rate (e.g. precursor flow rate), doping concentration, temperature, pressure, or other conditions. The sixth ARC 401, the seventh ARC 403, and the eighth ARC 405 may comprise the same material with different physical properties, such as doping concentration, dopant type, defect type or density, mismatch type or density, or other properties.

In some embodiments, the sixth ARC 401, the seventh ARC 403, and the eighth ARC 405 may each comprise the same material, but the precursor flow rates may be different during formation of each of the sixth ARC 401, the seventh ARC 403, and the eighth ARC 405 such that each of the sixth ARC 401, the seventh ARC 403, and the eighth ARC 405 has different index of refraction. For example, the sixth ARC 401, the seventh ARC 403, and the eighth ARC 405 may each be silicon nitride, but the flow rate of the precursors of each may be different to form silicon nitride having different indices of refraction. For example, silicon nitride may be formed using $SiH_4$ as a first precursor, $N_2$ as a second precursor, and $NH_3$ as a third precursor, and the sixth ARC 401 may be formed with a first precursor flow rate of between 40 sccm and 300 sccm, such as about 110 sccm, a second precursor flow rate of between 2000 sccm and 20000 sccm, such as about 8000 sccm, and a third precursor flow rate of between 20 sccm and 300 sccm, such as about 80 sccm so that the sixth ARC 401 will have a first refractive index of 1.9.

The silicon nitride of the seventh ARC 403 may be formed with a first precursor flow rate of between 40 sccm and 300 sccm, such as about 90 sccm, a second precursor flow rate of between 2000 sccm and 20000 sccm, such as about 7000 sccm, and a third precursor flow rate of between 20 sccm and 300 sccm, such as about 60 sccm so that the sixth ARC 403 will have a first refractive index of 2.0. The silicon nitride of the seventh ARC 405 may be formed with a first precursor flow rate of between 40 sccm and 300 sccm, such as about 60 sccm, a second precursor flow rate of between 2000 sccm and 20000 sccm, such as about 5000 sccm, and a third precursor flow rate of between 20 sccm and 300 sccm, such as about 30 sccm so that the sixth ARC 405 will have a first refractive index of 2.1.

In some embodiments, the sixth ARC 401, the seventh ARC 403, and the eighth ARC 405 may each comprise the same material, but the formation pressure may be different during formation of each of the sixth ARC 401, the seventh ARC 403, and the eighth ARC 405 such that each of the sixth ARC 401, the seventh ARC 403, and the eighth ARC 405 has different index of refraction. For example, the sixth ARC 401, the seventh ARC 403, and the eighth ARC 405 may each be silicon nitride, but the formation pressure of each may be different to form silicon nitride having different indices of refraction. For example, the sixth ARC 401 may be formed with a pressure of 1 torr to have a first refractive index of 1.9, the silicon nitride of the seventh ARC 403 may be formed with a pressure of 5 torr to have a second refractive index of 2.0, and the silicon nitride of the eighth ARC 405 may be formed with a pressure of 20 torr to have a third refractive index of 2.1.

In some embodiments, the sixth ARC 401, the seventh ARC 403, and the eighth ARC 405 may each comprise the same material, but the formation temperature may be different during formation of each of the sixth ARC 401, the seventh ARC 403, and the eighth ARC 405 such that each of the sixth ARC 401, the seventh ARC 403, and the eighth ARC 405 has different index of refraction. For example, the sixth ARC 401, the seventh ARC 403, and the eighth ARC 405 may each be silicon nitride, but the formation temperature of each may be different to form silicon nitride having different indices of refraction. For example, the sixth ARC 401 may be formed with a temperature of 250° C. to have a first refractive index of 1.9, the silicon nitride of the seventh ARC 403 may be formed with a temperature of 350° C. to have a second refractive index of 2.0, and the silicon nitride of the eighth ARC 405 may be formed with a temperature of 410° C. to have a third refractive index of 2.1.

In some embodiments, the sixth ARC 401, the seventh ARC 403, and the eighth ARC 405 may each comprise the same material, but the formation temperature may be different during formation of each of the sixth ARC 401, the seventh ARC 403, and the eighth ARC 405 such that each of the sixth ARC 401, the seventh ARC 403, and the eighth ARC 405 has different index of refraction. For example, the sixth ARC 401, the seventh ARC 403, and the eighth ARC 405 may each be silicon nitride doped with hydrogen, but may have a different doping concentration to have different indices of refraction. For example, the sixth ARC 401 may be formed with a doping concentration of $1E20/cm^3$ to have a first refractive index of 1.9, the seventh ARC 403 may be formed with a doping concentration of $5E20/cm^3$ to have a second refractive index of 2.0, and the eighth ARC 405 may be formed with a doping concentration of $1E21/cm^3$ to have a third refractive index of 2.1.

Figure 5:
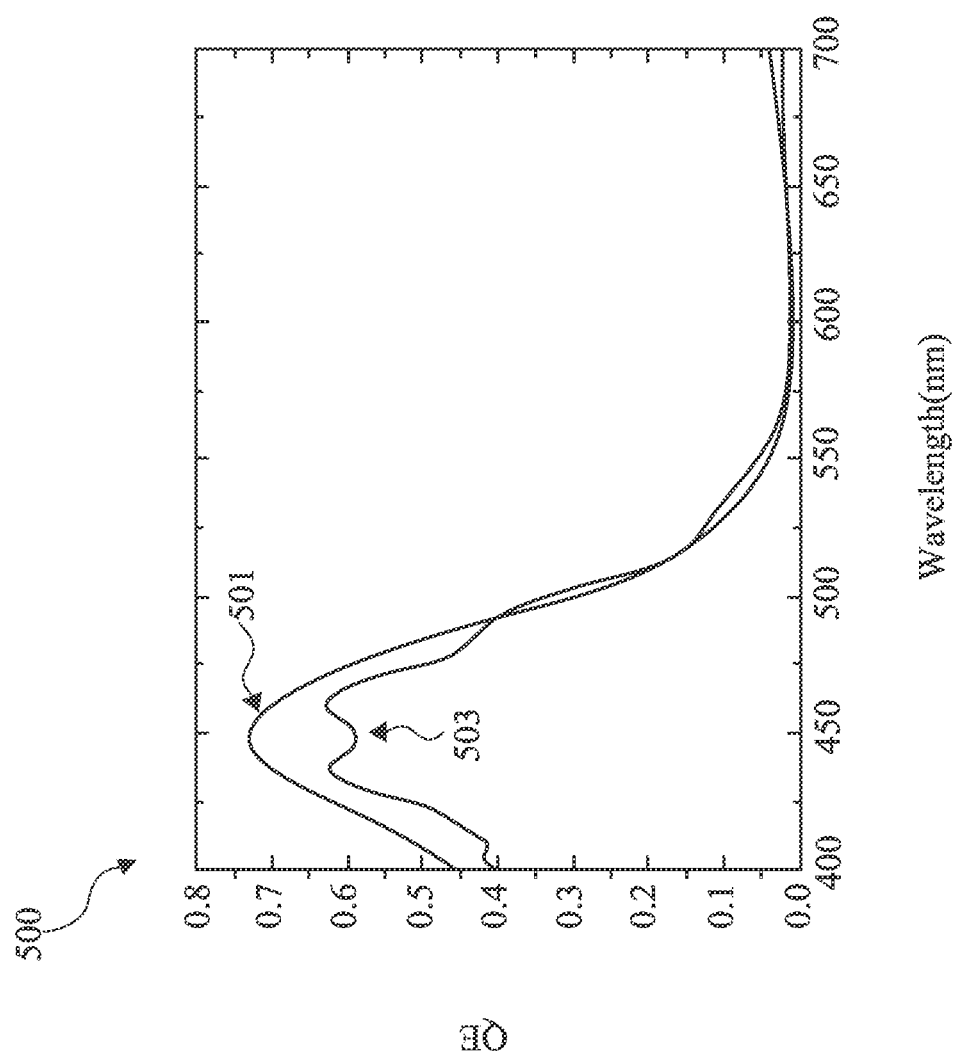
FIG. 5 illustrates a graph of quantum efficiency of a photosensitive diode with different anti-reflection coatings in accordance with some embodiments.

FIG. 5 illustrates a graph 500 showing an example of the quantum efficiency (QE) of a photosensitive diode. First curve 501 depicts the QE for the photosensitive diode with a blue color filter and a single ARC whose thickness has been chosen to maximize QE for only blue light. Second curve 503 depicts the QE for the photosensitive diode with a blue color filter and a single ARC whose thickness has been chosen to maximize QE for all three of blue light, green light, and red light. As graph 500 shows, QE can be improved by using an ARC designed for a specific color of light rather than an ARC designed for multiple colors of light.

Figure 6B:
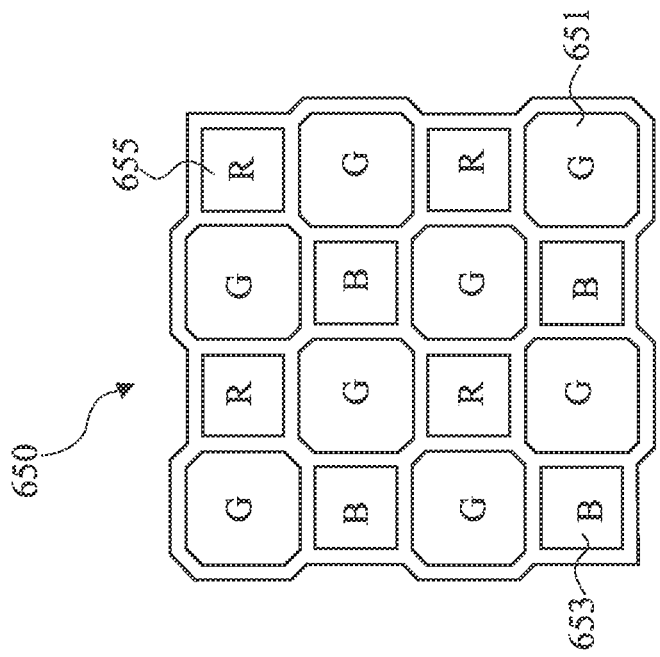
FIGS. 6A-6B illustrate arrays of pixel regions in accordance with some embodiments.
Figure 6A:
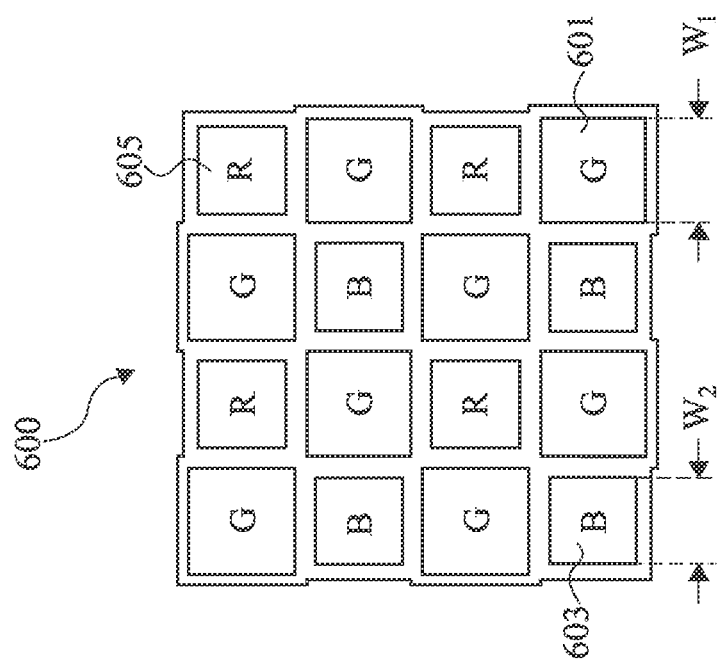

FIGS. 6A-6B illustrate embodiments of a first pixel array 600 and a second pixel array 650. The first pixel array 600 and second pixel array 650 may be part of an image sensor such as image sensor 100. For example, the first pixel array 600 and the second pixel array 650 may be part of pixel array 110 shown in FIG. 1A. The first pixel array 600 includes multiple pixel regions, shown in FIG. 6A by a first green pixel region 601, a first blue pixel region 603, and a first red pixel region 605. The first green pixel region 601, the first blue pixel region 603, and the first red pixel region 605 may be similar to the first pixel region 103, the second pixel region 105, and/or the third pixel region 107 as described in the discussion of FIG. 1A. In the embodiment, the first green pixel region 601 is associated with green light. For example, the first green pixel region 601 may have a green color filter and an ARC designed for green light. Similarly, the first blue pixel region 603 is associated with blue light and the first red pixel region 605 is associated with red light. The first green pixel region 601, the first blue pixel region 603, and the first red pixel region 605 may be arranged in a Bayer RGB pattern, a Yotsuba CRGB pattern, or any other suitable pattern.

FIG. 6A illustrates an embodiment in which the first green pixel region 601 has a larger area than the first blue pixel region 603 or the first red pixel region 605. For example, the first green pixel region 601 may have a first width $w_1$ and the first blue pixel region 603 and first red pixel region 605 may each have a same second width $w_2$. As shown in FIG. 6A, the first green pixel region 601 may have longer first width $w_1$ than the corresponding second width $w_2$ of the first blue pixel region 603 and the first red pixel region 605. The first width $w_1$ may, for example, be longer than the second width $w_2$ by 1%, 5%, 10%, 100%, or another amount. In an embodiment, the second width $w_2$ may be between about 0.8 µm and about 1.5 µm, such as about 1 µm, and the first width $w_1$ may be between about 1 µm and about 1.3 µm, such as about 1.1 µm. In an embodiment, the area of the first green pixel region 601 may be between 1 µm² and 1.69 µm², such as about 1.21 µm², and the areas of the first blue pixel region 603 and the first red pixel region 605 may be between 0.64 µm² and 1.1025 µm², such as about 1 µm². In some cases, the larger area of the first green pixel region 601 allows the first green pixel region 601 to receive more illumination than the first blue pixel region 603 or the first red pixel region 605.

In some embodiments, the first green pixel region 601 may comprise or be defined by one or more implants that have a different width, area, or shape than that of the first blue pixel region 603 or the first red pixel region 605. The implants of the first green pixel region 601 may also have a different concentration, implant ion, doping profile, anneal temperature, or other different characteristics than the first blue pixel region 603 or the first red pixel region 605. In other embodiments the pixel regions may have other widths or areas. For example, the first green pixel region 601 may have a different width or area than the first blue pixel region 603, and the first blue pixel region 603 may have a different width or area than the first red pixel region 605.

FIG. 6B illustrates an embodiment of a second pixel array 650 including a second green pixel region 651, a second blue pixel region 653, and a second red pixel region 655. As shown in FIG. 6B, the second green pixel region 651 has a different shape than the second blue pixel region 653 and the second red pixel region 655. The second green pixel regions 651 have an octagonal shape and the second blue pixel region 653 and the second red pixel region 655 have square shapes. In some cases, the octagonal shape of the second green pixel region 651 allows the relative size of the second green pixel region 651 to be larger and thus receive more illumination than the second blue pixel region 653 or the second red pixel region 655. In some embodiments, the second green pixel region 651 may comprise or be defined by one or more implants that have a different width, area, or shape than that of the second blue pixel region 653 or the second red pixel region 655. The implants of the second green pixel region 651 may also have a different concentration, implant ion, doping profile, anneal temperature, or other different characteristics than the second blue pixel region 653 or the second red pixel region 655. In other embodiments, the pixel regions may have other shapes or be arranged in other patterns. For example, the pixel regions may be square, rectangular, octagonal, polygonal, irregular, or other shapes, and have straight or rounded corners.

In some embodiments, each type of pixel region may have a different shape. For example, the second green pixel region 651 may have an octagonal shape, the second blue pixel region 653 may have a square shape, and the second red pixel region 655 may have a rectangular shape. In some embodiments, a single type of pixel region may have more than one shape. For example, one green pixel region in the pixel array may be an octagon of a first size, and another green pixel region in the same pixel array may be an octagon of a second size. As another example, one green pixel region in the pixel array may be a square, and another green pixel region in the same pixel array may be a rectangle.

By increasing the relative size of the green pixel regions (e.g., the first green pixel region 601 or the second green pixel region 651), a greater portion of the incident illumination impinges on the green pixel regions and thus the illumination received by the green pixel regions may be increased. In some cases, the illumination received by the image sensor may have peak intensity near green, and thus increasing the relative area of the green pixel regions may result in increased quantum efficiency or increased the signal-to-noise ratio (SNR) of the image sensor. Increasing the relative size of the green pixel regions may also allow more efficient energy distribution over different pixel regions in the image sensor, where the energy E (eV) of light with a wavelength λ (nm) is given by:

$$E = \frac{1240 \text{ eVnm}}{\lambda}.$$

Figure 7:
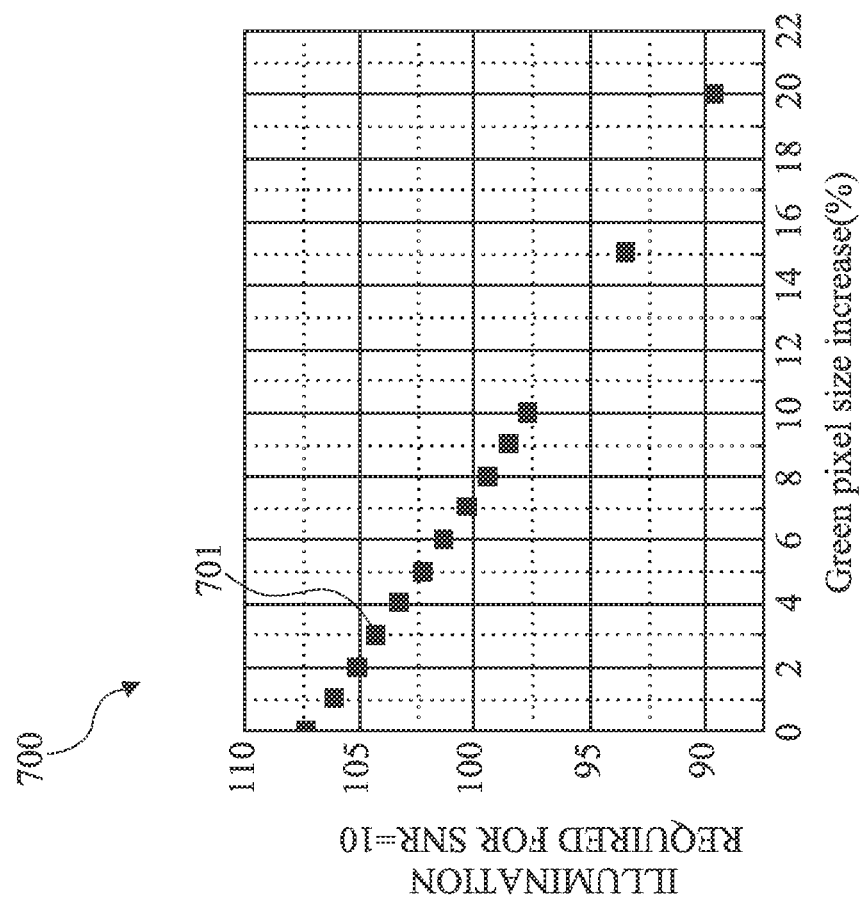
FIG. 7 illustrates a graph of signal-to-noise ratio versus green pixel size in accordance with some embodiments.

FIG. 7 illustrates an example graph 700 showing that increased green pixel region size may allow a greater signal-to-noise ratio (SNR). Data points 701 show the illumination power (arbitrary units) to produce SNR=10 for a given relative green pixel region size. In graph 700, the green pixel size is given as the percent increase of a width of a green pixel region relative to the red and blue pixel regions. As FIG. 7 shows, increasing the relative size of the green pixel regions can decrease the illumination to achieve a given SNR.

In some embodiments, one or more of the pixel regions shown in FIGS. 6A-B may include one or more of the ARCs shown in FIGS. 1B and 2-4. For example, the first green pixel region 601 or the second green pixel region 651 may include an ARC that is configured to reduce reflection from green light. Likewise, the first blue pixel region 603 or the second blue pixel region 653 may include an ARC that is configured to reduce reflection from blue light, and the first red pixel region 605 or the second red pixel region 655 may include an ARC that is configured to reduce reflection from red light. For example, the first green pixel region 601 may include second ARC 171, the first blue pixel region 603 may include first ARC 161, and the first red pixel region 605 may include third ARC 181. This is an example; other configurations and combinations of pixel regions and ARCs may be used. In some embodiments, the image sensor is a front-side illuminated image sensor.

By forming different ARCs on different pixel regions, the overall quantum efficiency and/or signal-to-noise ratio of an image sensor may be improved. In some cases, the use of different ARCs in different pixel regions may reduce crosstalk between the pixel regions, as each pixel region can be configured or optimized for a different color of light. A pixel region configured for a certain color of light can have a reduced amount of noise due to unwanted color light impinging on the photodiode. As each pixel region may include ARCs configured for certain colors of light, the thicknesses of each color filter over each pixel region may be reduced. A thinner color filter may allow the overall thickness of the image sensor to be reduced.

In accordance with an embodiment, a method of manufacturing an image sensor device, the method includes implanting ions in a first region of a substrate to form a first photosensitive diode; implanting ions in a second region of the substrate to form a second photosensitive diode, wherein the first region is adjacent the second region; depositing a first layer comprising a first material over the first region, wherein the first layer is a first anti-reflection coating having first anti-reflective properties; and depositing a second layer comprising a second material over the second region, wherein the second layer is a second anti-reflection coating having second anti-reflective properties different from the first anti-reflective properties, and wherein the second layer has a same thickness as the first layer. In an embodiment, depositing the first layer includes depositing a first sublayer and depositing a second sublayer over the first sublayer. In an embodiment, the first sublayer includes the first material. In an embodiment, depositing the second layer includes depositing a third sublayer having a different thickness than the first sublayer and depositing a fourth sublayer over the third sublayer, the fourth sublayer having a different thickness than the second sublayer. In an embodiment, the third sublayer includes the first material. In an embodiment, depositing the first layer further includes depositing a fifth sublayer over the second sublayer, and wherein depositing the second layer further includes depositing a sixth sublayer over the fourth sublayer. In an embodiment, the second material is different from the first material. In an embodiment, a first area of the first layer in plan view is greater than a second area of the second layer in plan view. In an embodiment, the first area is from about 5% to about 100% greater than the second area.

In accordance with another embodiment, a method includes depositing a first material to a first thickness over a first pixel region in a semiconductor substrate; depositing the first material to a second thickness over a second pixel region in the semiconductor substrate, wherein the second thickness is different from the first thickness, and depositing a second material over the first pixel region and the second pixel region at the same time, wherein a top surface of the second material above the first pixel region is a same height above the semiconductor substrate as a top surface of the second material above the second pixel region, wherein the first material over the first pixel region and the second material over the first pixel region are part of a first anti-reflective coating (ARC) that reduces reflection for a first wavelength range of incident light, and wherein the first material over the second pixel region and the second material over the second pixel region are part of a second ARC that reduces reflection for a second wavelength range of incident light that is different from the first wavelength range of incident light. In an embodiment, the first pixel region has different dimensions than the second pixel region. In an embodiment, the first pixel region has a different shape than the second pixel region. In an embodiment, the method also includes planarizing the second material. In an embodiment, the method also includes implanting ions in the first pixel region to form a first photosensitive diode and implanting ions in the second pixel region to form a second photosensitive diode.

In accordance with yet another embodiment, a method includes forming a first anti-reflective coating (ARC) over a first photodiode in a semiconductor device, the first ARC having a first area in plan view, including depositing a first dielectric material over the first photodiode and forming a second ARC over a second photodiode in the semiconductor device, the second ARC having a second area in plan view that is different than the first area, including depositing a second dielectric material over the second photodiode, wherein the second dielectric material is different than the first dielectric material, wherein the first ARC has a same thickness as the second ARC. In an embodiment, forming the first ARC further includes depositing the second dielectric material over the first photodiode, and wherein forming the second ARC further includes forming the first dielectric material over the second photodiode. In an embodiment, the first ARC is adjacent the second ARC. In an embodiment, the method further includes forming a first color filter over the first ARC and forming a second color filter over the second ARC. In an embodiment, the first dielectric material is an oxide and the second dielectric material is a nitride. In an embodiment, forming the first ARC further includes depositing a third dielectric material over the first photodiode, and wherein forming the second ARC further includes forming the third dielectric material over the second photodiode, wherein the third dielectric material is different than the first dielectric material and the second dielectric material.

In accordance with yet another embodiment, a method includes forming a first photosensitive diode and a second photosensitive diode in a semiconductor substrate; depositing a first material over the first photosensitive diode and the second photosensitive diode; after depositing the first material, depositing a second material over the first photosensitive diode, the second material being different from the first material, wherein a top surface of the first material above the second photosensitive diode is exposed after depositing the second material; forming a first color filter over the first photosensitive diode; and forming a second color filter over the second photosensitive diode, a topmost surface of the first color filter being level with a topmost surface of the second color filter.

In accordance with yet another embodiment, a method includes forming a first pixel region, a second pixel region and a third pixel region in a semiconductor substrate; depositing a first material over first pixel region, a second pixel region and a third pixel region; after depositing the first material, depositing a second material over the first pixel region and the second pixel region, the second material being different from the first material, wherein a top surface of the first material above the third pixel region is exposed after depositing the second material; after depositing the second material, depositing a third material over the first pixel region, the third material being different from the first material and the second material, wherein the top surface of the first material above the third pixel region is exposed after depositing the third material; forming a first color filter over the first pixel region; forming a second color filter over the second pixel region; and forming a third color filter over the third pixel region, a topmost surface of the first color filter being level with a topmost surface of the second color filter and a topmost surface of the third color filter.

In accordance with yet another embodiment, a method includes forming a first pixel region, a second pixel region and a third pixel region in a semiconductor substrate; forming a first anti-reflection coating (ARC) over the first pixel region, wherein forming the first ARC includes: forming a first dielectric material over the first pixel region, the first dielectric material having a first thickness; forming a second dielectric material over the first dielectric material, the second dielectric material being different from the first dielectric material, the second dielectric material having a second thickness; and forming a third dielectric material over the second dielectric material; forming a second ARC over the second pixel region, wherein forming the second ARC includes: forming the first dielectric material over the second pixel region, the first dielectric material having the first thickness; and forming the second dielectric material over the first dielectric material, the second dielectric material having the second thickness; forming a third ARC over the third pixel region, wherein forming the third ARC includes forming the first dielectric material over the third pixel region, the first dielectric material having the first thickness; forming a first color filter over the first ARC; forming a second color filter over the second ARC; and forming a third color filter over the third ARC, a topmost surface of the first color filter being level with a topmost surface of the second color filter and a topmost surface of the third color filter.

In accordance with yet another embodiment, a method includes: forming a first photosensitive diode and a second photosensitive diode in a semiconductor substrate; and forming a first anti-reflection coating (ARC) over the first photosensitive diode and a second ARC over the second photosensitive diode, where forming the first ARC over the first photosensitive diode and the second ARC over the second photosensitive diode includes: depositing a first material over the first photosensitive diode and the second photosensitive diode; after depositing the first material, depositing a second material over the first photosensitive diode, the second material being different from the first material, where a top surface of the first material above the second photosensitive diode is not covered by the second material after depositing the second material; and after depositing the second material, depositing a third material over the first photosensitive diode, the third material being different from the first material and the second material, where a top surface of the second material above the first photosensitive diode is covered by the third material after depositing the third material, where the top surface of the first material above the second photosensitive diode is not covered by the second material while depositing the third material, and where the top surface of the first material above the second photosensitive diode is not covered by the third material after depositing the third material.

In accordance with yet another embodiment, a method includes: forming a first pixel region, a second pixel region and a third pixel region in a semiconductor substrate, where forming the first pixel region, the second pixel region and the third pixel region includes: forming a first photosensitive diode in the semiconductor substrate in the first pixel region; forming a second photosensitive diode in the semiconductor substrate in the second pixel region; forming a third photosensitive diode in the semiconductor substrate in the third pixel region; forming a first anti-reflection coating (ARC) over the first photosensitive diode, where forming the first ARC includes: forming a first dielectric material over the first photosensitive diode; forming a second dielectric material over the first dielectric material, the second dielectric material being different from the first dielectric material; and forming a third dielectric material over the second dielectric material; forming a second ARC over the second photosensitive diode, where forming the second ARC includes: forming the first dielectric material over the second photosensitive diode; and forming the second dielectric material over the first dielectric material; forming a third ARC over the third photosensitive diode, where forming the third ARC comprises forming the first dielectric material over the third photosensitive diode; forming a first color filter over the first ARC, the first color filter having a first thickness; forming a second color filter over the second ARC, the second color filter having a second thickness different from the first thickness; and forming a third color filter over the third ARC, the third color filter having a third thickness different from the second thickness, a topmost surface of the first color filter being level with a topmost surface of the second color filter and a topmost surface of the third color filter.

In accordance with yet another embodiment, a method includes: forming a first pixel region, a second pixel region and a third pixel region over a semiconductor substrate, where forming the first pixel region, the second pixel region and the third pixel region includes: forming a first photosensitive diode in the semiconductor substrate in the first pixel region; forming a second photosensitive diode in the semiconductor substrate in the second pixel region; forming a third photosensitive diode in the semiconductor substrate in the third pixel region; and forming a first anti-reflection coating (ARC) over the first photosensitive diode, a second ARC over the second photosensitive diode, and a third ARC over the third photosensitive diode, where forming the first ARC over the first photosensitive diode, the second ARC over the second photosensitive diode, and the third ARC over the third photosensitive diode includes: depositing a first material over the first photosensitive diode, the second photosensitive diode and the third photosensitive diode; after depositing the first material, depositing a second material over the first photosensitive diode and the second photosensitive diode, the second material being different from the first material, where a thickness of the second material is between about 20 Å and about 5000 Å, and where a top surface of the first material above the third photosensitive diode is not covered by the second material after depositing the second material; and after depositing the second material, depositing a third material over the first photosensitive diode, the third material being different from the first material and the second material, where a top surface of the second material above the first photosensitive diode is covered by the third material after depositing the third material, and where the top surface of the first material above the third photosensitive diode is not covered by the third material after depositing the third material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first photosensitive diode and a second photosensitive diode in a semiconductor substrate; and
   forming a first anti-reflection coating (ARC) over the first photosensitive diode and a second ARC over the second photosensitive diode, wherein forming the first ARC over the first photosensitive diode and the second ARC over the second photosensitive diode comprises:
      depositing a first material over the first photosensitive diode and the second photosensitive diode;
      after depositing the first material, depositing a second material over the first photosensitive diode, the second material being different from the first material, wherein a top surface of the first material above the second photosensitive diode is not covered by the second material after depositing the second material;
      after depositing the second material, depositing a third material over the first photosensitive diode, the third material being different from the first material and the second material, wherein a top surface of the second material above the first photosensitive diode is covered by the third material after depositing the third material, wherein the top surface of the first material above the second photosensitive diode is not covered by the second material while depositing the third material, and wherein the top surface of the first material above the second photosensitive diode is not covered by the third material after depositing the third material;
   forming a first color filter over the first photosensitive diode; and
   forming a second color filter over the second photosensitive diode, wherein the second color filter is in physical contact with the first material and the second material.

2. The method of claim 1, wherein a topmost surface of the first color filter is level with a topmost surface of the second color filter.

3. The method of claim 2, wherein a thickness of the first color filter is different from a thickness of the second color filter.

4. The method of claim 2, wherein a bottommost surface of the first color filter is above a bottommost surface of the second color filter.

5. The method of claim 1 further comprising forming a third photosensitive diode in the semiconductor substrate, wherein the second ARC extends over the third photosensitive diode.

6. The method of claim 1, wherein a portion of the semiconductor substrate is interposed between the first photosensitive diode and the first ARC.

7. A method comprising:
   forming a first pixel region, a second pixel region and a third pixel region in a semiconductor substrate, wherein forming the first pixel region, the second pixel region and the third pixel region comprises:
      forming a first photosensitive diode in the semiconductor substrate in the first pixel region;
      forming a second photosensitive diode in the semiconductor substrate in the second pixel region;
      forming a third photosensitive diode in the semiconductor substrate in the third pixel region;
      forming a first anti-reflection coating (ARC) over the first photosensitive diode, wherein forming the first ARC comprises:
         forming a first dielectric material over the first photosensitive diode;
         forming a second dielectric material over the first dielectric material, the second dielectric material being different from the first dielectric material; and
         forming a third dielectric material over the second dielectric material;
      forming a second ARC over the second photosensitive diode, wherein forming the second ARC comprises:
         forming the first dielectric material over the second photosensitive diode; and
         forming the second dielectric material over the first dielectric material;
      forming a third ARC over the third photosensitive diode, wherein forming the third ARC comprises forming the first dielectric material over the third photosensitive diode, wherein the third ARC is free of the second dielectric material;
      forming a first color filter over the first ARC, the first color filter having a first thickness;

forming a second color filter over the second ARC, the second color filter having a second thickness different from the first thickness, wherein a sidewall of the second color filter is flush with a sidewall of the second dielectric material; and forming a third color filter over the third ARC, the third color filter having a third thickness different from the second thickness, a topmost surface of the first color filter being level with a topmost surface of the second color filter and a topmost surface of the third color filter.

8. The method of claim 7, wherein the third dielectric material is different from the first dielectric material.

9. The method of claim 8, wherein the third dielectric material is different from the second dielectric material.

10. The method of claim 7, wherein the first dielectric material of the first ARC, the first dielectric material of the second ARC and the first dielectric material of the third ARC are formed using a same deposition process.

11. The method of claim 7, wherein the second dielectric material of the first ARC and the second dielectric material of the second ARC are formed using a same deposition process.

12. The method of claim 7, wherein the first pixel region and the second pixel region have different areas.

13. The method of claim 7, wherein the first pixel region is a green pixel region and the second pixel region is a blue pixel region, and wherein a width of the first pixel region is greater than a width of the second pixel region.

14. The method of claim 7, wherein a top surface of the second dielectric material of the second ARC over the second photosensitive diode is level with a top surface of the second dielectric material of the first ARC over the first photosensitive diode.

15. A method comprising:
forming a first pixel region, a second pixel region and a third pixel region over a semiconductor substrate, wherein forming the first pixel region, the second pixel region and the third pixel region comprises:
forming a first photosensitive diode in the semiconductor substrate in the first pixel region;
forming a second photosensitive diode in the semiconductor substrate in the second pixel region;
forming a third photosensitive diode in the semiconductor substrate in the third pixel region; and
forming a first anti-reflection coating (ARC) over the first photosensitive diode, a second ARC over the second photosensitive diode, and a third ARC over the third photosensitive diode, wherein forming the first ARC over the first photosensitive diode, the second ARC over the second photosensitive diode, and the third ARC over the third photosensitive diode comprises:
depositing a first material over the first photosensitive diode, the second photosensitive diode and the third photosensitive diode;
after depositing the first material, depositing a second material over the first photosensitive diode and the second photosensitive diode, the second material being different from the first material, wherein a thickness of the second material is between about 20 Å and about 5000 Å, wherein a thickness of the second material over the first photosensitive diode is the same as a thickness of the second material over the second photosensitive diode, and wherein a top surface of the first material above the third photosensitive diode is not covered by the second material after depositing the second material; and
after depositing the second material, depositing a third material over the first photosensitive diode, the third material being different from the first material and the second material, wherein a top surface of the second material above the first photosensitive diode is covered by the third material after depositing the third material, and wherein the top surface of the first material above the third photosensitive diode is not covered by the third material after depositing the third material.

16. The method of claim 15, wherein forming the first pixel region, the second pixel region and the third pixel region further comprises:
forming a first color filter over the first photosensitive diode;
forming a second color filter over the second photosensitive diode; and
forming a third color filter over the third photosensitive diode, a topmost surface of the first color filter being level with a topmost surface of the second color filter and a topmost surface of the third color filter.

17. The method of claim 16, wherein a thickness of the third color filter is greater than a thickness of the second color filter.

18. The method of claim 16, wherein the thickness of the second color filter is greater than a thickness of the first color filter.

19. The method of claim 15, wherein the first pixel region has a different shape than the second pixel region.

20. The method of claim 15, wherein a thickness of the first material is between about 20 Å and about 5000 Å.

* * * * *